United States Patent [19]

Choi

[11] Patent Number: 5,500,080
[45] Date of Patent: Mar. 19, 1996

[54] PROCESS OF FORMING CONTACT HOLES

[75] Inventor: Yang K. Choi, Kyoungki-do, Rep. of Korea

[73] Assignee: Hyundai Electroncis Industries Co., Ltd., Kyoungki-do, Rep. of Korea

[21] Appl. No.: 264,167

[22] Filed: Jun. 22, 1994

[30] Foreign Application Priority Data

Jun. 22, 1993 [KR] Rep. of Korea .................. 93-11362

[51] Int. Cl.⁶ .................................................. H01L 21/00
[52] U.S. Cl. ........................ 156/644.1; 156/656.1; 156/657.1; 156/659.11; 216/46; 437/233; 437/238; 437/245
[58] Field of Search ................ 437/41, 52, 228, 437/180, 233, 238, 241, 245; 156/644.1, 656.1, 657.1, 659.11, 662.1, 643.1, 651.1, 661.11; 216/17, 39, 42, 46

[56] References Cited

U.S. PATENT DOCUMENTS 5,174,858  12/1992  Yamamoto et al. ............... 437/52 X

*Primary Examiner*—William Powell
*Attorney, Agent, or Firm*—Popham, Haik, Schnobrich & Kaufman, Ltd.

[57] ABSTRACT

A process for forming self-aligned contact holes in a semiconductor device. In the process, a barrier layer for limiting an opened area of each contact hole is formed by use of a blanket etching process and a chemical vapor deposition process. This method eliminates the use of a mask patterning process upon formation of the selective metal layer to be used as the barrier layer, thereby minimizing the mask misalignment rate and the tolerance caused by the mask misalignment. By virtue of such features, the contact hole formation process enables formation of contact holes each having a minimum opened area enough to form a contact.

3 Claims, 4 Drawing Sheets

5,500,080

PROCESS OF FORMING CONTACT HOLES

BACKGROUND OF THE INVENTION

1. Field of the Invention

The present invention relates to a process of forming a multilayer conduction wiring of a highly integrated semiconductor device, and more particularly, to a process of forming self-aligned contact holes to form contacts for connecting upper and lower conduction wirings to each other in a highly integrated semiconductor device.

2. Description of the Prior Art

Recently, highly integrated semiconductor devices have had a greater increase in integration degree. Due to such a trend, the area occupied by elements constituting a semiconductor device has sharply reduced. As a result, the tolerance in masking and etching steps involved in fabricating semiconductor device is more limited. Such a limiting tolerance results in a very high aspect ratio and a very small diameter of the contacts which is electrically adopted to the upper and lower conduction wiring layers, disposed over and beneath an intermediate conduction layer, respectively. Where an insulating layer coated over the intermediate conduction wiring layer is selectively etched to form holes for the contacts, the intermediate conduction layer may be partially exposed when masks used for the intermediate conduction wiring and the contact holes are misaligned. To prevent such an exposure of the intermediate conduction layer, a barrier layer is formed over the intermediate conduction wiring layer.

Since the barrier layer is formed by an etching process using a mask, poor contact holes may be formed when the mask used for the barrier layer is misaligned from the mask used for the contacts. This problem will now be described in detail, in conjunction with FIG. 1.

FIG. 1 is a sectional view of a semiconductor device having contact holes formed in accordance with a conventional contact hole forming process. FIG. 1 shows the lower conduction layer 1. Disposed over the lower conduction layer 1 are: a first insulating layer 2, a conduction wiring layer 4, a second insulating layer 5, a barrier pattern 6 and a third insulating layer 8. The barrier pattern 6 is created by the formation of a barrier material layer made of polysilicon to a predetermined thickness over the second insulating layer 5 and then by patterning the barrier material layer by the mask etching process. The barrier pattern 6 overlaps the entire side wall of the conduction wiring 4 and a portion of the upper surface of the first insulating layer 2. To form contact holes 10 through which the lower conduction layer 1 is selectively exposed, the third insulating layer 8, the second insulating layer 5 and the first insulating layer 2, are selectively removed by the use of an etching process utilizing masks as contacts. The contact holes 10 are formed in a self-aligned manner by the barrier pattern 6 so that they have a smaller area than that of the contact regions predetermined by the contact mask.

FIG. 2 is a sectional view of a semiconductor device having poor contact holes formed in accordance with the conventional method shown in FIG. 1. Such poor contact holes result from a misalignment between the mask of the barrier layer and the mask of the contact holes. In FIG. 2, the mask for the barrier layer is shown as being misaligned to the right side. Because of this misalignment of the mask of the barrier layer, the barrier layer pattern 6 is disposed as being shifted to the right side. As a result, the contact holes 10, formed by etching the third insulating layer 8, the second insulating layer 5 and the first insulating layer 2, have a very small area due to the misalignment of the contact mask in the left side, thereby causing the contacts to be abnormally formed.

SUMMARY OF THE INVENTION

Therefore, the objective of the invention is to provide a contact hole forming process capable of accurately forming contact holes each having a minimum opening area enough to form a contact.

In accordance with the present invention, this objective can be accomplished by providing a process of forming self-aligned contact holes in a semiconductor device, comprising the steps of: forming a first insulating layer over a lower conduction layer; forming a conduction wiring over the first insulating layer and sequentially coating a second insulating layer and a conduction layer over the entire exposed upper surface of the resulting structure; blanket dry etching the conduction layer, thereby forming conduction layer spacers respectively on side walls of the conduction wiring; growing a selective metal layer over each of the conduction layer spacers such that the selective metal layer is overlapped with both a predetermined upper surface portion of the conduction wiring and a predetermined upper surface portion of the first insulating layer; and forming a third insulating layer over the entire exposed upper surface of the resulting structure, etching portions of the third insulating layer, corresponding to contact regions by use of a contact mask, and selectively etching both the second insulating layer and the first insulating layer exposed by the selective metal layer which is exposed upon etching the third insulating layer and is used as a barrier layer, thereby forming contact holes through which the first conduction layer is partially exposed.

BRIEF DESCRIPTION OF THE DRAWINGS

Other objectives and aspects of the invention will become apparent from the following description of embodiment with reference to the accompanying drawings.

DETAILED DESCRIPTION OF THE PREFERRED EMBODIMENTS

Figure 1:
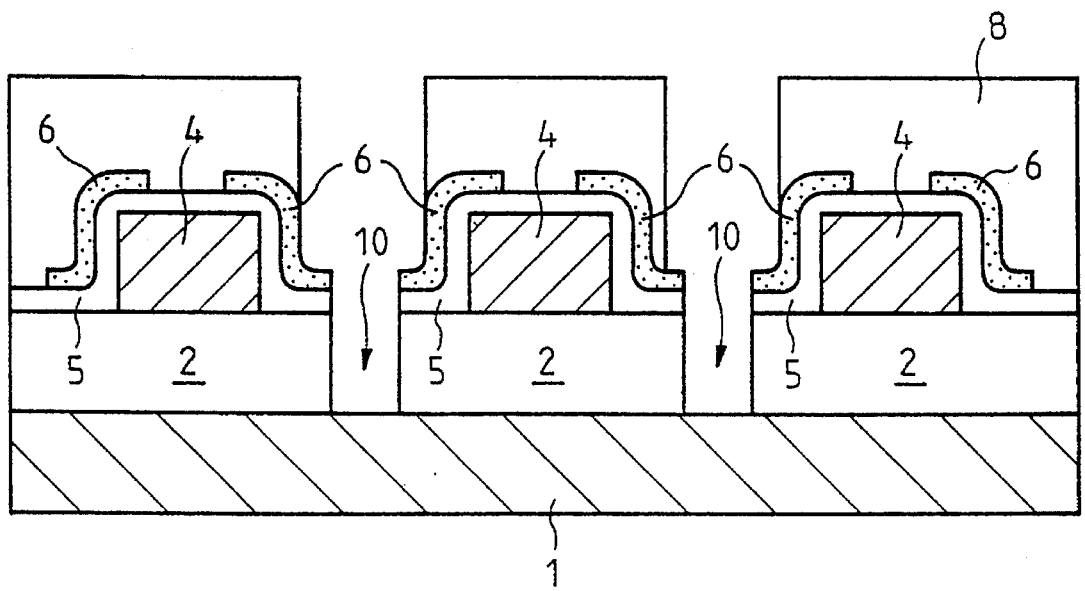
FIG. 1 is a sectional view of a semiconductor device having contact holes formed in accordance with a conventional contact hole forming process.
Figure 2:
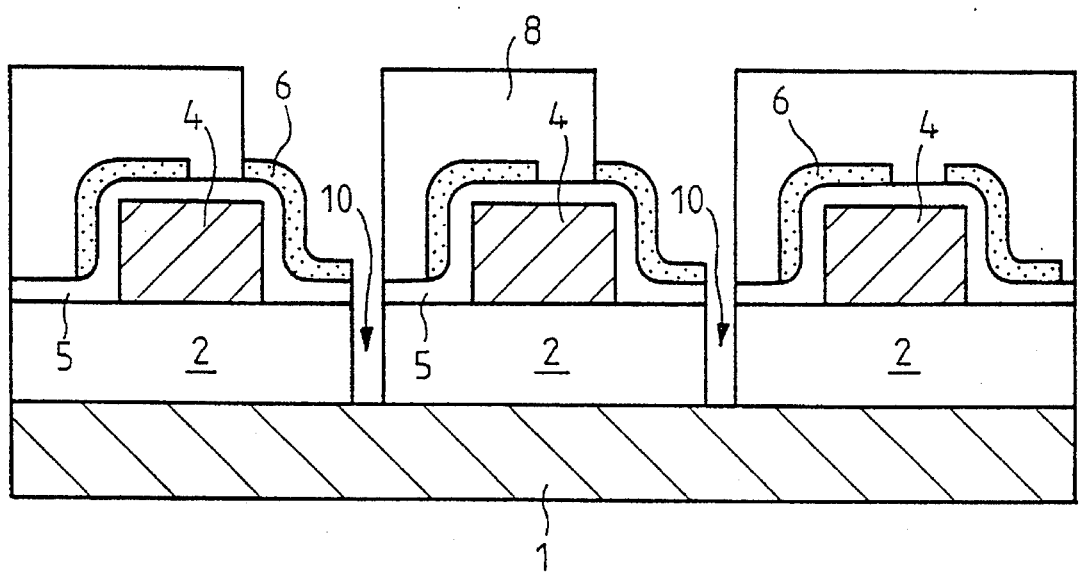
FIG. 2 is a sectional view of a semiconductor device having poor contact holes formed in accordance with the conventional method shown in FIG. 1.

FIGS. 3A to 3E are sectional views, respectively, illustrating a process for forming contact holes in accordance with an embodiment of the present invention. Elements in FIGS. 3A to 3E corresponding to those in FIGS. 1 and 2 are denoted by the same reference numerals.

Figure 3A:
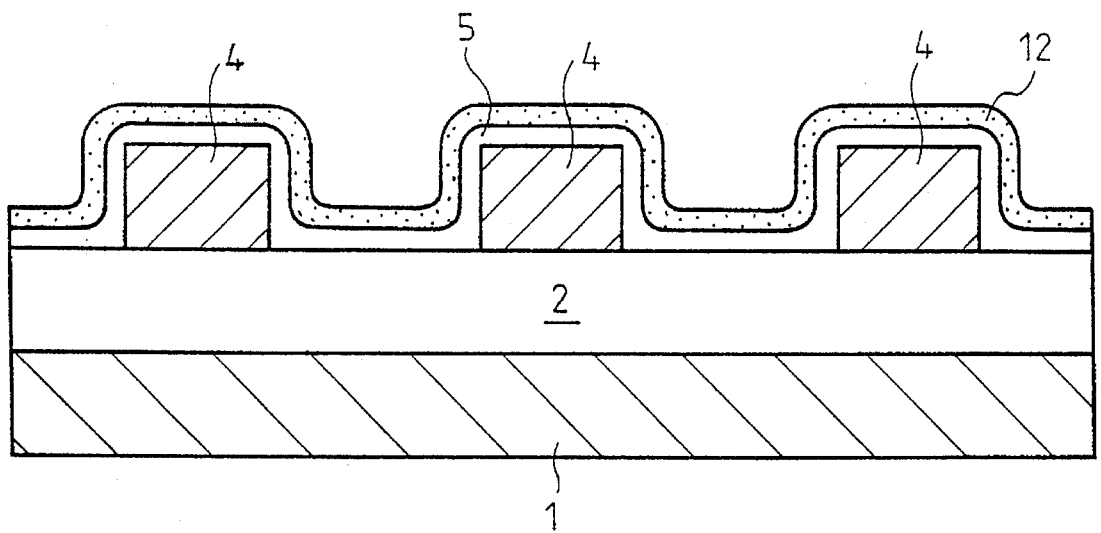
FIGS. 3A to 3E are sectional views, respectively, illustrating a process for forming contact holes in accordance with an embodiment of the present invention.

Referring to FIG. 3A, a semiconductor device is illustrated which includes a first, lower conduction layer 1, a first insulating layer 2 formed over the lower conduction layer 1, and a second conduction wiring layer 4 formed on the first insulating layer 2. Over the entire exposed upper surface of the structure, a second insulating layer 5 and a third conduction layer 12 are sequentially coated. The first insulating layer 2 is comprised of an oxide film, whereas the second insulating layer 5 is comprised of a TEOS film. The third conduction layer 12 is comprised of a polysilicon layer.

Figure 3B:
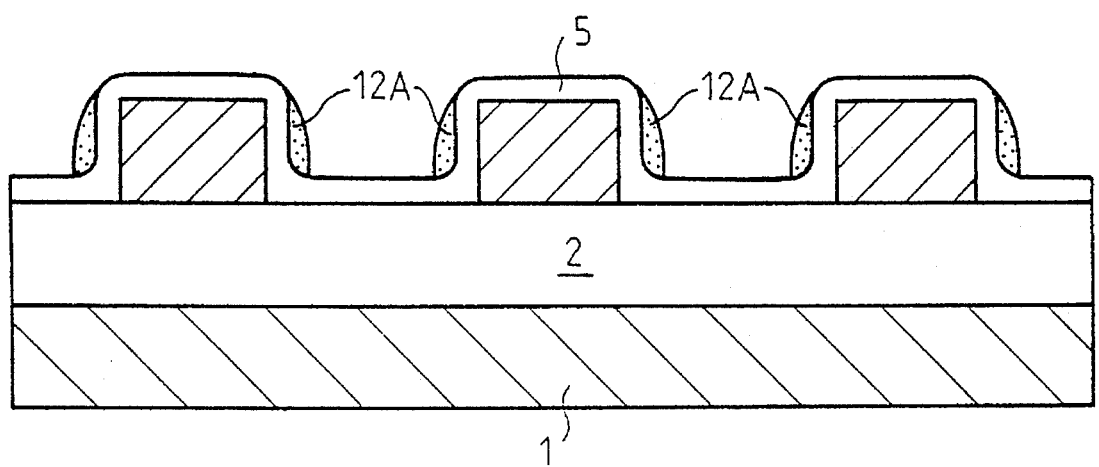

The third conduction layer 12 is then subjected to a blanket dry etching process, thereby forming conduction layer spacers 12A on side walls of the second insulating layer 5, as shown in FIG. 3B.

Figure 3C:
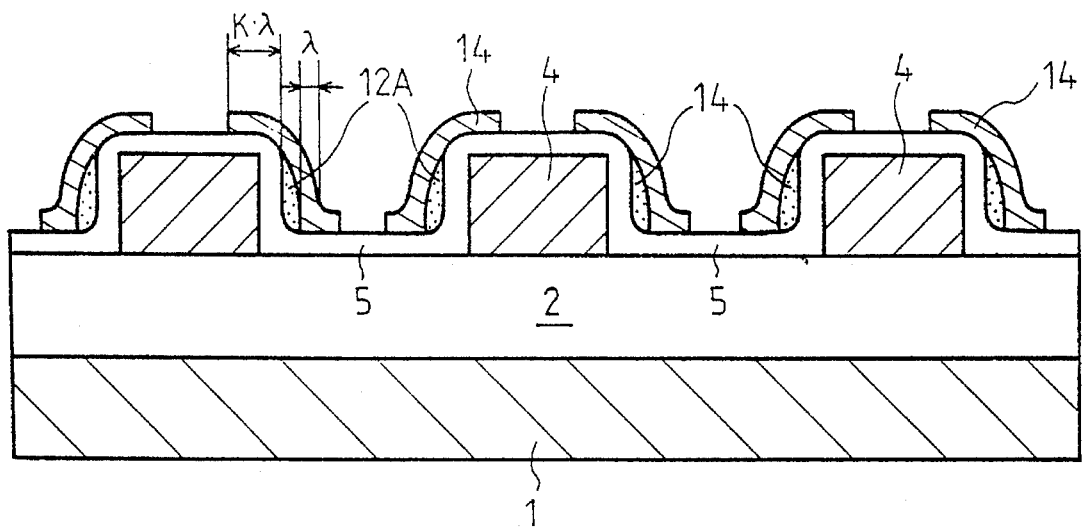

After completing the steps shown in FIG. 3B, a selective metal layer 14 is formed over the conduction layer spacers 12A, as shown in FIG. 3C. Formation of the selective metal layer 14 is achieved by growing the conduction layer spacers 12A by use of a chemical vapor deposition process. The selective metal layer 14 is grown to a width of $\lambda$ from the outer side wall surface of each conduction layer spacer 12A. The selective metal layer 14 is also grown to a width of $K \cdot \lambda$ ($K \geq 1$) from the inner side wall surface of each conduction layer spacer 12A that is contact with the corresponding side wall surface portion of the second insulating layer 5. As a result, the selective metal layer 14 is overlapped with both the second conduction wiring layer 4 and the first insulating layer 2 by the width of $K \cdot \lambda$.

Figure 3D:
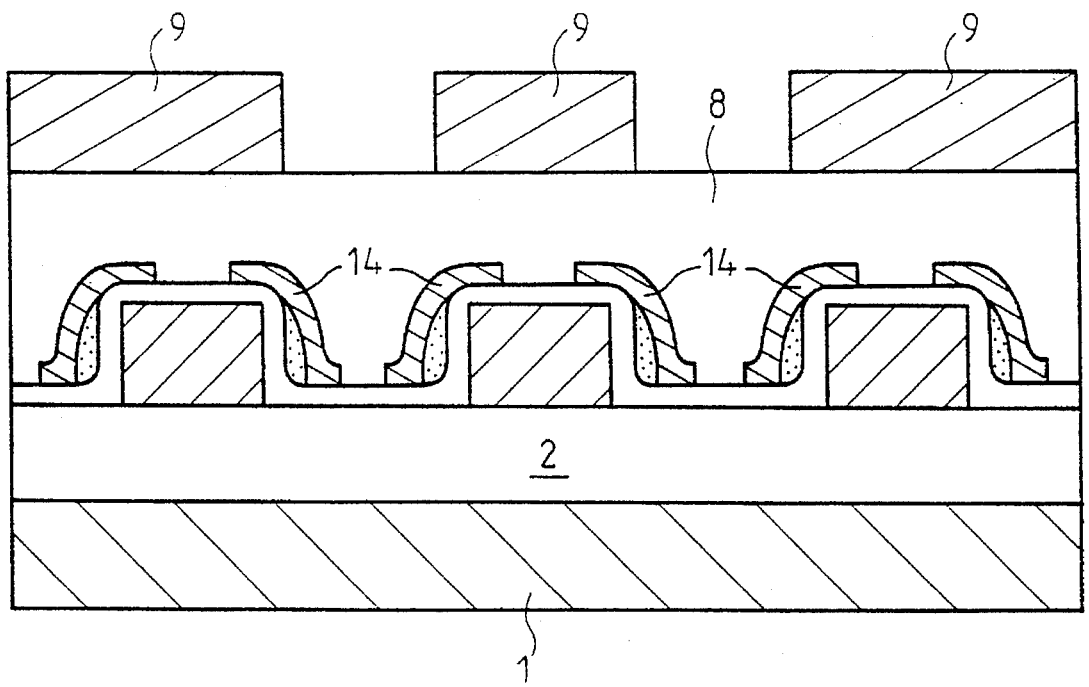
Figure 3E:
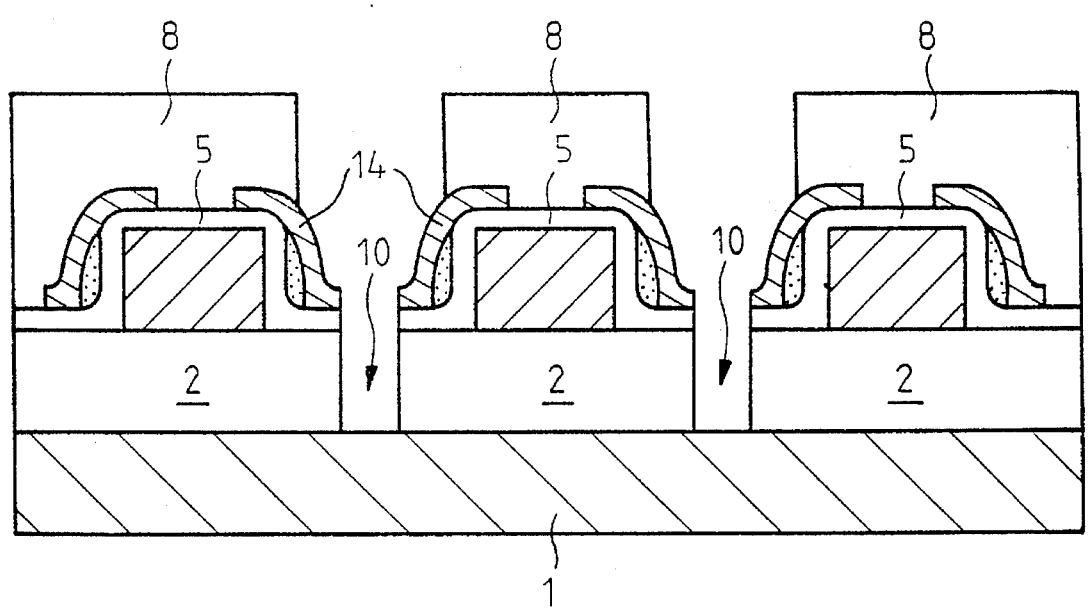

Over the entire exposed upper surface of the resulting structure shown in FIG. 3C, a third insulating layer 8 and a photoresist pattern 9 for a contact mask are sequentially coated, as shown in FIG. 3D. Through the photoresist pattern 9, the third insulating layer 8 is partially exposed.

After completing of the step shown in FIG. 3C, the third insulating layer 8, the second insulating layer 5 and the first insulating layer 2 are subjected to an etching process using the photoresist pattern 9 as the contact mask. At the etching step, a portion of the third insulating layer 8 exposed through the photoresist pattern 9 and portions of the second insulating layer 5 and first insulating layer 2 disposed beneath the exposed portion of the third insulating layer 8 are sequentially removed, thereby forming contact holes 10 through which the lower conduction layer 1 is selectively exposed. Each of the contact holes 10 has an opened area identical to that of a corresponding opening defined by the selective metal layer 14 and smaller than that of a corresponding opening formed at the photoresist pattern 9 for the contact mask. The opened area of the contact hole 10 may be adjusted in the chemical vapor deposition process used for forming the selective metal layer 14.

As apparent from the above description, the contact hole formation process in accordance with the present invention eliminates the use of a mask patterning process upon formation of the selective metal layer to be used as the barrier layer. Accordingly, it is possible to minimize the mask misalignment rate and the tolerance caused by the mask misalignment. By virtue of such features, the contact hole formation process of the present invention enables formation of contact holes each having a minimum opened area enough to form a contact. As a result, semiconductor integrated circuit devices exhibiting an improvement in integration degree.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A process for forming self-aligned contact holes in a semiconductor device, comprising the steps of:

forming a first insulating layer over a lower conduction layer, forming a conduction wiring over the first insulating layer and sequentially coating a second insulating layer and a conduction layer over the entire exposed upper surface of the resulting structure;

blanket dry etching the conduction layer, thereby forming conduction layer spacers respectively on side walls of the conduction wiring;

growing a selective metal layer over each of the conduction layer spacers such that the selective metal layer overlaps a constant width of both an upper surface portion of the conduction wiring and an upper surface portion of the first insulating layer; and forming a third insulating layer over the entire exposed upper surface of the resulting structure, etching portions of the third insulating layer corresponding to contact regions by use of a contact mask, and selectively etching both the second insulating layer and the first insulating layer exposed the selective metal layer which is exposed upon etching the third insulating layer and is used as a barrier layer, thereby forming contact holes through which the first conduction layer is partially exposed.

2. A process in accordance with claim 1, wherein the conduction layer spacers are comprised of a doped polysilicon layer.

3. A process in accordance with claim 1, wherein the selective metal layer is comprised of a tungsten layer.

* * * * *